(12) United States Patent
Oh

(10) Patent No.: US 11,670,556 B2
(45) Date of Patent: Jun. 6, 2023

(54) SEMICONDUCTOR PACKAGE

(71) Applicant: Samsung Electronics Co., Ltd., Suwon-si (KR)

(72) Inventor: Jeongjoon Oh, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 68 days.

(21) Appl. No.: 17/448,769

(22) Filed: Sep. 24, 2021

(65) Prior Publication Data

US 2022/0013420 A1    Jan. 13, 2022

Related U.S. Application Data

(63) Continuation of application No. 16/877,838, filed on May 19, 2020, now Pat. No. 11,158,550.

(30) Foreign Application Priority Data

Oct. 25, 2019    (KR) .................. 10-2019-0134001

(51) Int. Cl.
*H01L 23/00*    (2006.01)
*H01L 21/66*    (2006.01)
(Continued)

(52) U.S. Cl.
CPC .......... *H01L 22/32* (2013.01); *H01L 21/4853* (2013.01); *H01L 21/4857* (2013.01);
(Continued)

(58) Field of Classification Search
CPC . H01L 22/32; H01L 21/4853; H01L 21/4857; H01L 21/565; H01L 22/12;
(Continued)

(56) References Cited

U.S. PATENT DOCUMENTS 8,264,849 B2    9/2012    Guzek
8,736,065 B2    5/2014    Gonzalez et al.
(Continued)

FOREIGN PATENT DOCUMENTS

KR    1020090027573 A    3/2009
KR    1020180029483 A    3/2018

*Primary Examiner* — Elias Ullah
(74) *Attorney, Agent, or Firm* — Myers Bigel, P.A.

(57) ABSTRACT

A semiconductor package includes a frame having a first surface, a second surface opposite the first surface, and a through-hole, a first semiconductor chip in the through-hole of the frame, a second semiconductor chip on the frame, a first connection structure on the first surface of the frame and including a first redistribution structure electrically connected to the first semiconductor chip and having a third surface contacting the first surface of the frame, the first redistribution structure including a first redistribution layer and a first redistribution via, a first pad on a center portion of a fourth surface of the first redistribution structure opposite the third surface, a second pad on an edge portion of the fourth surface, a second connection structure on the second surface and comprising a second redistribution structure electrically connected to the second semiconductor chip and including a second redistribution layer and a second redistribution via, and an electrical connection metal on the first pad on the fourth surface, wherein the electrical connection metal is not on the second pad.

20 Claims, 13 Drawing Sheets

(51) Int. Cl.
    *H01L 23/31*     (2006.01)
    *H01L 23/538*     (2006.01)
    *H01L 21/48*     (2006.01)
    *H01L 21/56*     (2006.01)

(52) U.S. Cl.
    CPC ............ *H01L 21/565* (2013.01); *H01L 22/12* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/48* (2013.01); *H01L 2224/214* (2013.01); *H01L 2224/48227* (2013.01)

(58) Field of Classification Search
    CPC ............ H01L 23/3128; H01L 23/5383; H01L 23/5386; H01L 23/5389; H01L 24/19; H01L 24/20; H01L 24/48; H01L 2224/214; H01L 2224/48227; H01L 25/03; H01L 23/49816; H01L 2224/05599; H01L 2224/2919; H01L 2224/32145; H01L 2224/32225; H01L 2224/33181; H01L 2224/45099; H01L 2224/48228; H01L 2224/48235; H01L 22/14; H01L 25/0657; H01L 2224/73215; H01L 2224/73265; H01L 2224/85444; H01L 2224/96; H01L 23/13; H01L 23/3135; H01L 23/495; H01L 23/525; H01L 24/06

See application file for complete search history.

(56) References Cited

U.S. PATENT DOCUMENTS

| | | |
|---|---|---|
| 8,901,724 B2 | 12/2014 | Guzek et al. |
| 9,972,601 B2 | 5/2018 | Meyer et al. |
| 2009/0065773 A1 | 3/2009 | Ishikawa et al. |
| 2014/0091440 A1 | 4/2014 | Nair et al. |
| 2015/0235994 A1 | 8/2015 | Ohba et al. |
| 2018/0076178 A1 | 3/2018 | Park et al. |
| 2018/0096979 A1 | 4/2018 | Pappu et al. |

SEMICONDUCTOR PACKAGE

CROSS-REFERENCE TO RELATED APPLICATION

This application is a continuation of U.S. application Ser. No. 16/877,838, filed May 19, 2020, which claims benefit of priority to Korean Patent Application No. 10-2019-0134001 filed on Oct. 25, 2019 in the Korean Intellectual Property Office, the disclosure of which is incorporated herein by reference in its entirety.

BACKGROUND

1. Field

The present disclosure relates to semiconductor packages and, more particularly, to semiconductor packages for partitioned semiconductor chips.

2. Description of Related Art

As smart electronic devices have been developed in recent years, specifications of components used in such devices have also advanced. For example, specifications of an application processor (AP), which may be a key component of a smart electronic device, have rapidly advanced. Various methods have been used for advancing the performance of the AP, and functional partitioning of the AP is one method that has been used. For example, when partitioning a semiconductor chip die of the AP for each function, and then designing and packaging each semiconductor chip to be optimized for process and features thereof, the AP may provide more advanced performance than a conventional single AP. In this implementation, however, a high-level packaging method may be required. Accordingly, there may be a demand for a semiconductor package structure in which a plurality of partitioned semiconductor chips may be packaged to have improved signal and power characteristics.

SUMMARY

Some embodiments of the inventive concept provide a semiconductor package having improved reliability.

According to some embodiments of the inventive concept, a semiconductor package includes a frame comprising a first surface, a second surface opposite the first surface, a through-hole, and a wiring structure including a wiring layer and a wiring via, a first semiconductor chip in the through-hole of the frame and comprising a first connection pad, a first connection structure on the first surface of the frame, and having a third surface and a fourth surface opposing the third surface, the first semiconductor chip being on the third surface, the first connection structure further comprising a first redistribution structure electrically connected to the first connection pad and the wiring structure, the first redistribution structure including a first redistribution layer and a first redistribution via, a second connection structure on the second surface of the frame and comprising a second redistribution structure electrically connected to the wiring structure, the second redistribution structure including a second redistribution layer and a second redistribution via, a first pad and a second pad on the fourth surface of the first connection structure and electrically connected to the second redistribution structure, a first passivation layer on the fourth surface of the first connection structure and having a plurality of openings, the first and second pads being accessible via the plurality of openings, a second semiconductor chip on the second connection structure and including a second connection pad electrically connected to the second redistribution structure through a bonding wire, and an electrical connection metal only on the first pad, wherein the first and second redistribution structures and the wiring structure provide a control signal path electrically connecting the first connection pad of the first semiconductor chip and the second connection pad of the second semiconductor chip and a test signal path electrically connecting the second connection pad of the second semiconductor chip and the second pad.

According to some embodiments of the inventive concept, a semiconductor package includes a frame having a first surface, a second surface opposite the first surface, and a through-hole, a first semiconductor chip in the through-hole of the frame, a second semiconductor chip on the frame, a first connection structure on the first surface of the frame and comprising a first redistribution structure electrically connected to the first semiconductor chip and having a third surface contacting the first surface of the frame, the first redistribution structure including a first redistribution layer and a first redistribution via, a first pad on a center portion of a fourth surface of the first redistribution structure opposite the third surface, a second pad on an edge portion of the fourth surface, a second connection structure on the second surface and comprising a second redistribution structure electrically connected to the second semiconductor chip and including a second redistribution layer and a second redistribution via, and an electrical connection metal on the first pad on the fourth surface, wherein the electrical connection metal is not on the second pad.

According to some embodiments of the inventive concept, a semiconductor package includes a frame comprising a first surface, a second surface opposite the first surface, a through-hole, and a wiring structure including a wiring layer and a wiring via, a first semiconductor chip in the through-hole of the frame and comprising a first connection pad, a first connection structure on the first surface of the frame and comprising a first redistribution structure electrically connected to the first semiconductor chip and including a first redistribution layer and a first redistribution via, a first passivation layer on the first connection structure and having a testing opening in an edge portion of the first connection structure, a second connection structure on the second surface and comprising a second redistribution structure including a second redistribution layer and a second redistribution via, a second semiconductor chip on the second connection structure and electrically connected to the second redistribution structure, the second semiconductor chip including a second connection pad, and a test pad electrically connected to the first redistribution structure and having a lower surface accessible via the testing opening, wherein the first and second redistribution structures and the wiring structure provides a test signal path electrically connecting the second connection pad of the second semiconductor chip and the test pad.

BRIEF DESCRIPTION OF DRAWINGS

The above and other aspects, features and other advantages of the present disclosure are more clearly understood from the following detailed description taken in conjunction with the accompanying drawings, in which.

DETAILED DESCRIPTION

Figure 1:
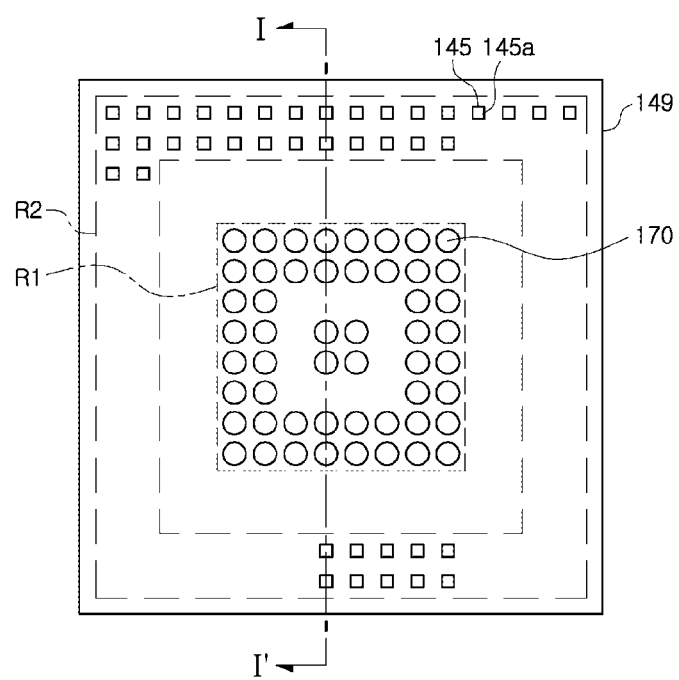
FIG. 1 is a plan view illustrating a semiconductor package according to some example embodiments of the present inventive concept.

Hereinafter, example embodiments of the inventive concept will be described in detail with reference to the attached drawings. The same reference numerals of the same reference designators may denote the same elements or components throughout the specification. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a plan view illustrating a semiconductor package according to some example embodiments of the present inventive concept.

Figure 2:
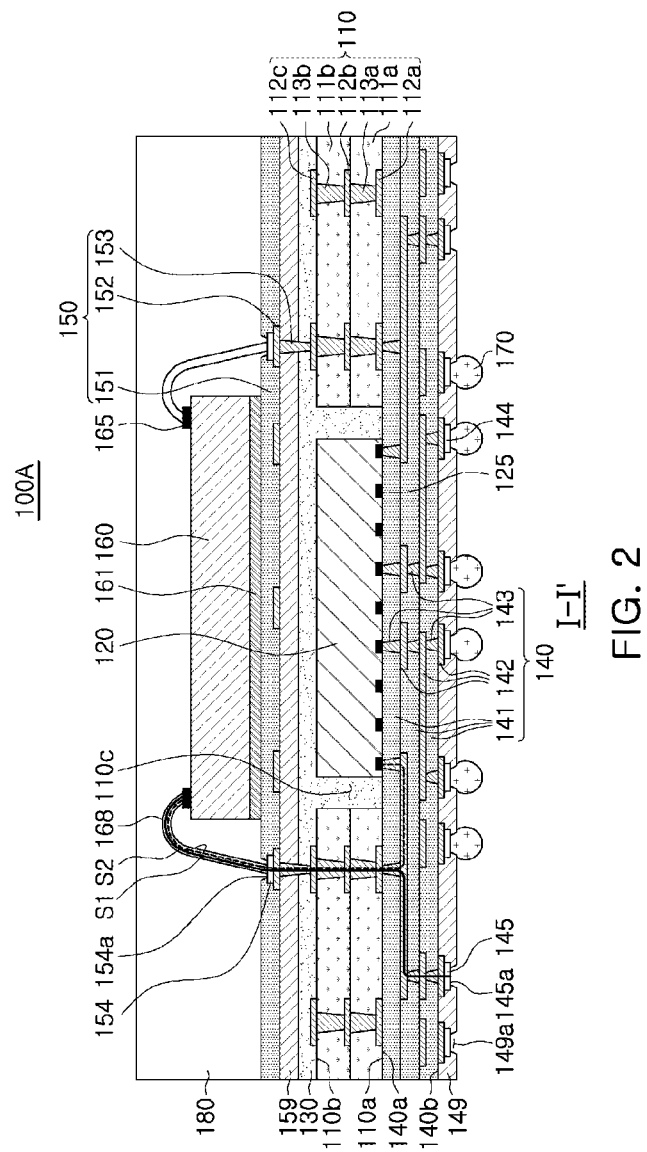
FIG. 2 is a cross-sectional view taken along line I-I' of FIG. 1 illustrating a semiconductor package according to some example embodiments of the present inventive concept.

FIG. 2 is a cross-sectional taken along line I-I' of FIG. 1 view illustrating a semiconductor package according to some example embodiments of the present inventive concept.

Referring to FIGS. 1 and 2, a semiconductor package 100 (referring collectively to semiconductor packages 100A, 100B, and 100C) may include a frame 110 having a first surface 110a, a second surface 110b opposed to the first surface 110a, a through-hole 110c, a first semiconductor chip 120 disposed in the through-hole 110c of the frame 110 and including a first connection pad 125, an encapsulant 130 encapsulating the first semiconductor chip 120 and disposed on the second surface 110b of the frame 110, a first connection structure 140 disposed on the first surface 110a of the frame 110 and having a third surface 140a on which the first semiconductor chip 120 is disposed and a fourth surface 140b opposed to the third surface 140a, a first passivation layer 149 disposed on the fourth surface 140b of the first connection structure 140 and having a plurality of openings in the fourth surface 140b, first and second pads 144 and 145 having a lower surface at least partially exposed by a plurality of the openings of the first passivation layer 149, a second connection structure 150 disposed on the second surface 110b of the frame 110, a third pad 154 disposed on the second connection structure 150 and having an at least partially exposed upper surface, a second passivation layer 159 disposed between the encapsulant 130 and the second connection structure 150, a second semiconductor chip 150 disposed on the second connection structure 150, and an electrical connection metal 170 disposed on a plurality of the openings of the first passivation layer 149, and a molding material 180 disposed on the second connection structure 150 and being on and covering at least a portion of the second semiconductor chip 160.

The frame 110 includes a through-hole 110c, and the first semiconductor chip 120 may be disposed in the through-hole 110c such that a surface on which the first connection pad 125 is disposed faces the third surface 140a of the first connection structure 140. The frame 110 may include a wiring structure having first to third wiring layers 112a to 112c and first and second wiring via layers 113a and 113b. The frame 110 includes a first insulating layer 111a in physical contact with the third surface 140a of the first connection structure 140, a first wiring layer 112a in physical contact with the third surface 140a of the first connection structure 140 and embedded in the first insulating layer 111a, a second wiring layer 112b disposed on an opposite side to a side on which the first wiring layer 112a of the first insulating layer 111a is embedded, a second insulating layer 111b disposed on a side opposite to a side on which the first wiring layer 112a of the first insulation layer 111a is disposed and being on and covering at least a portion of the second wiring layer, a third wiring layer 112c disposed on a side opposite to a side on which the second wiring layer 112b of the second insulating layer 111b is embedded, a first wiring via layer 113a passing through the first insulating layer 111a and electrically connecting the first and second wiring layers 112a and 112b, and a second wiring via layer passing through the second insulating layer 111b and electrically connecting the second and third wiring layers 112b and 112c.

An insulating material may be used as a material of the first and second insulating layers 111a and 111b. A thermosetting resin, such as an epoxy resin, a thermoplastic resin, such as a polyimide resin, or an insulating material, such as prepreg, Ajinomoto Build up Film (ABF), FR-4, a Bismaleimide Triazine (BT) resin, a material containing a resin impregnated in a reinforcement material, such as an inorganic filler, and/or a glass fiber (glass cloth, class fabric), or the like, may be used as the insulating material.

The first to third wiring layers 112a to 112c may be configured to redistribute the first connection pad 125 of the first semiconductor chip 120 and provide a pad pattern for the wiring via layers 113a and 113b for connecting the upper/lower portions of the semiconductor package 100A. The first to third wiring layers 112a to 112c may be formed of a metal, such as Cu, Al, Ag, Sn, Au, Ni, Pb, Ti, or alloys thereof. The first to third wiring layers 112a to 112c may have various functions according to a device design. For example, the first to third wiring layers 112a to 112c may include a ground pattern, a power pattern, a signal pattern, and the like. The signal pattern may include various signals, such as a data signal, excluding the ground pattern and power pattern. As used herein, the term "pattern" may include a wire and a pad.

The first and second wiring via layers 113a and 113b electrically connect the first to third wiring layers 112a to 112c formed on different layers, thereby forming an electric path inside the frame 110. Further, the first and second wiring via layers 113a and 113b forms an electrical path between the first connection structure 140 and the electrical connection metal 170. The first and second wiring via layers 113a and 113b may be formed of a metal. The first and second wiring via layers 113a and 113b may be a field via at least partially filled with metal materials or a conformal via in which the metal materials are formed along a wall surface of the via hole. The first and second wiring via layers 113a and 113b may have a tapered shape. In some embodiments, the first and second wiring via layers 113a and 113b may be integrated with at least a portion of the first to third wiring layers 112a to 112c, but are not limited thereto.

The first and second semiconductor chips 120 and 160 may be integrated circuits (ICs), which may include several hundreds to several millions or more elements integrated in a single chip. As a non-limiting example, the first and second semiconductor chips 120 and 160 may be configured in a combination to provide a single complete application processor (AP). In this case, the first and second semiconductor chips 120 and 160 may provide a circuit in which some functions of the AP are divided between the first and second semiconductor chips 120 and 160; for example, a central processor (CPU), a graphics processor (GPU), a field programmable gate array (FPGA), a digital signal processor, a cryptographic processor, a microprocessor, and/or a microcontroller, or the like, but embodiments are not limited thereto. Other embodiments may include other functions not described herein, which are divided between two or more chips of an AP. At least one of the first and second semiconductor chips 120 and 160 may be a memory chip, such as a volatile memory (a dynamic random access memory (DRAM)), a non-volatile memory (a read only memory (ROM)), a flash memory, or the like. The first and second semiconductor chips 120 and 160 may have different specifications including functions and scales as previously described. For example, the second semiconductor chip 160 may be a chip having higher specifications, e.g., with respect to performance, capacity, and the like, than that of the first semiconductor chip 120. For example, the second semiconductor chip 160 may be bigger than the first semiconductor chip 120, but embodiments are not limited thereto. A semiconductor package according to some embodiments of the present inventive concept may include the first semiconductor chip 120 and the second semiconductor chip 160 as a controller and a flash memory, respectively, and the second semiconductor chip 160 may operate by way of connection to the first semiconductor chip 120. Such a semiconductor package may be, for example, an embedded multimedia Card (eMMC) or universal flash storage (UFS).

The encapsulant 130 may protect the frame 110, the first semiconductor chip 120, and the like. A sealing form of the encapsulant 130 is not limited to any particular type of configuration. For example, the encapsulant 130 may be on and at least partially cover the second surface 110b of the frame 110, and may be in and fill at least a portion of the through-hole 110c. As the encapsulant 130 at least partially fills the through-hole 110c, the encapsulant 130 may function as an adhesive and may decrease buckling depending on the specific material used.

A material of the encapsulant 130 is not limited to any particular type of material. For example, an insulating material may be used in some embodiments. The insulating material may comprise a thermosetting resin, such as an epoxy resin, a thermoplastic resin, such as a polyimide, or an insulating material, such as ABF, an epoxy molding compound (EMC), in which a resin is mixed with an inorganic filler or a resin is impregnated in a reinforcement material, such as a glass fiber (glass cloth, class fabric), or the like, together with the inorganic filler. In some embodiments, a photoimagable encapsulant (PIE) resin may be used.

The first connection structure 140 may include a first redistribution structure including a first redistribution layer 142 and a first redistribution via 143, and the second connection structure 150 may include a second redistribution structure including a second redistribution layer 152 and a second redistribution via 153. The first and second connection structures 140 and 150 may include first and second redistribution insulating layers 141 and 151, first and second redistribution layers 142 and 152 disposed on and the first and second redistribution insulating layers 141 and 151, and first and second redistribution vias 143 and 153 passing through the first and second redistribution insulating layers 141 and 151. The first connection structure 140 may be configured to include a large number of the first redistribution insulating layers 141, the first redistribution layers 142, and the first redistribution vias 143. The second connection structure 150 may be configured to include a large number of the second redistribution insulating layers 151, the second redistribution layers 152, and the second redistribution vias 153. In other embodiments, the first and second connection structure 140 and 150 may be configured to include a smaller number of the same.

The first connection structure 140 may redistribute the first connection pad 125 of the first semiconductor chip 120, and may further be connected to the wiring layers 112a to 112c of the frame 110, respectively, according to a function of the first connection pad 125. The second connection structure 150 may redistribute the second connection pad 165 of the second semiconductor chip 160. Further, the first and second connection structures 140 and 150 may be electrically connected to each other, and the first connection pad 126 may be electrically connected to the second connection pad 165. Tens to hundreds of the first and second connection pads 125 and 165 having various functions may be redistributed through the first and second connection structures 140 and 150, and may be physically and/or electrically connected to an exterior through an electrical connection metal 170 according to a function thereof.

The first and second redistribution insulating layers 141 and 151 may comprise an insulating material. The insulating material may comprise a photoimagable insulating material, such as a PID resin, in addition to the materials that comprise the insulating material of the encapsulant 130 described above. That is, the first and second redistribution insulating layers 141 and 151 may be a photoimagable insulating layer. The first and second redistribution insulating layers 141 and 151 may be photoimagable insulating layers containing an insulating resin and an inorganic filler. When the first and second redistribution insulating layers 141 and 151 have a multilayer structure, materials thereof may be identical, and may be different in accordance with various embodiments of the inventive concept. When the first and second redistribution insulating layers 141 and 151 have a multilayer structure, the insulating layers 141 and 151 may be integrated with each other based on a process, such that a boundary therebetween may not be apparent, but embodiments are not limited thereto.

The first and second redistribution layers 142 and 152 may substantially serve to redistribute the first and second connection pads 125 and 165, and may provide the previously described electrical connection path. The first redistribution layer 142 may be electrically connected to the first connection pad 125 and the wiring layers 112a to 112c, while the second redistribution layer 152 may be electrically connected to the wiring layers 112a to 112c. The first and second redistribution layers 142 and 152 may be formed of copper (Cu), aluminum (Al), silver (Ag), tin (Sn), gold (Au), nickel (Ni), lead (Pb), and/or titanium (Ti), or alloys thereof. The first and second redistribution layers 142 and 152 may have various functions according to a design pattern of a corresponding layer. For example, a ground pattern, a power pattern, a signal pattern, and the like, may be included. The signal pattern includes various signals, such as a data signal, excluding the ground pattern and power pattern. As used herein, the term "pattern" includes a wire and a pad.

The first redistribution via 143 is connected to the first redistribution layer 142, the first connection pad 125, and the lowermost third wiring layer 112c and electrically connects the first redistribution layer 142, the first connection pad 125, and the wiring layers 112a to 112c, which are disposed on different layers, to each other, and consequently forms an electrical path inside the first connection structure 140. The second redistribution via 153 electrically connects the second redistribution layer 152 and the second connection pad 165, which are disposed on different layers, to each other, and consequently forms an electrical path inside the second connection structure 150. The first and second redistribution vias 143 and 153 may be formed of a metal such as Cu, Al, Ag, Sn, Au, Ni, Pb, and/or Ti, or alloys thereof. The first and second redistribution vias 143 and 153 may be field-type vias at least partially filled with a metal or conformal-type vias formed along a wall surface of a via hole. The first and second redistribution vias 143 and 153 may have a tapered cross-section shape. Taper directions in the first and second redistribution vias 143 and 153 may be opposite to each other, and a taper direction of the first redistribution via 143 may be opposite to that of the wiring via layers 113a and 113b of the frame 110.

The first pad 144 may be disposed in a central region R1 of the fourth surface 140b of the first connection structure 140. The first pad 144 may be electrically connected to the first and second redistribution structures. The first pad 144 may be electrically connected to the first semiconductor chip 120 through the first redistribution layer 142, the first redistribution via 143, and the first connection pad 125. The first pad 144 may be electrically connected to an electrical connection metal 170 through a plurality of openings of the first passivation layer 149.

The second pad 145 may be electrically connected to the first and second redistribution structures. The second pad 145 may be electrically connected to the first semiconductor chip 120 through the first redistribution layer 142, the first redistribution via 143 and the first connection pad 125, and may be electrically connected to the second semiconductor chip 160 through the wiring layers 112a to 112c, wiring via layers 113a and 113b, the second redistribution layer 152, the second redistribution via 153 and the second connection pad 165. The second pad 145 is disposed in an edge region R2 of the fourth surface 140b of the first connection structure 140, and a lower surface 145a thereof may be at least partially exposed by one region of the fourth surface 140b defined by a testing opening 149a of the first passivation layer 149. A number and a shape of the second pads 145 being disposed in the edge region R2 of the fourth surface 140b are not limited thereto and may vary based on a device design. The electrical connection metal 170 may not be disposed on the second pad 145. An external connection terminal for testing is attached to the at least partially exposed lower surface 145a of the second pad 145 to provide a pad for testing a defect, such as a crack or a short, of the second semiconductor chip 160. The second pad 145 may be a test pad.

The third pad 154 may be electrically connected to the second redistribution layer 152 and the second redistribution via 153 and may be electrically connected to the second semiconductor chip 160 through a bonding wire 168. The third pad 154 may have an upper surface 154a at least partially exposed by a plurality of openings formed on the second redistribution insulating layer 151.

The first to third pads 144, 145 and 154 may include an Ni/Au layer, and may be an under bump metallurgy (UBM) pad, but embodiments are not limited thereto. A shape of a surface on which the first to third pads 144, 145 and 154 are exposed may be, for example, square, rhombus, round, or the like. The first to third pads 144, 145, and 154 may be Solder Mask Defined (SMD) BGA pads or Non-Solder Mask Defined (NSMD) BGA pads, but embodiments are not limited thereto.

The first passivation layer 149 is an additional configuration for protecting the first connection structure 140 from external physical or chemical damage, or the like. The first passivation layer 149 may cover at least a portion of the lowermost first redistribution layer 142 and the lowermost first redistribution insulating layer 141. The first passivation layer 149 may contain a thermosetting rein. For example, the first passivation layer 149 may be an ABF, but embodiments are not limited thereto. The first passivation layer 149 may have a plurality of openings exposing at least a portion of the lowermost first redistribution layer 142. The openings of the first passivation layer 149 may be provided in an amount of approximately several tens to several tens of thousands. Each opening may include a plurality of holes. At least one of the openings may be a test opening 149a disposed in the edge region R2 of the fourth surface 140b.

The second passivation layer 159 is an additional configuration for protecting the frame 110 from external physical or chemical damage, or the like. The second passivation layer 159 may also contain a thermosetting rein. The second passivation layer 159 may be an ABF, but embodiments are not limited thereto. The second passivation layer 159 may include a plurality of openings exposing at least a portion of the second redistribution layer 152. The openings of the second passivation layer 159 may be provided in an amount of approximately several tens to several tens of thousands. Each opening may include a plurality of holes.

The second semiconductor chip 160 may be disposed on an adhesive layer 161 disposed on the encapsulant 130. The adhesive layer 161 may be a layer configured to bond the encapsulant 130 and the second semiconductor chip 160. The second semiconductor chip 160 may include a second connection pad electrically connected to the third pad 154 through a bonding wire 168.

The electrical connection metal 170 is a configuration for physically and/or electrically connecting a semiconductor package 100A to an exterior, e.g., an element or component external to the semiconductor package 100A. For example, the semiconductor package 100A may be mounted on a mainboard of an electrical device through the electrical connection metal 170, and may thus be electrically connected to the exposed first redistribution layer 142. In some embodiments, an under bump metal may be formed in a plurality of the openings of the first passivation layer 149. In these embodiments, the electrical connection metal 170 may be electrically connected to the first redistribution layer 142 at least partially exposed through the under bump metal. The electrical connection metal 170 may contain a low-melting point metal, such as Sn or an alloy containing Sn. In some embodiments, the electrical connection metal 170 may be formed as a solder; however, this is merely an example, and embodiments of the material thereof are not limited thereto.

The electrical connection metal 170 may have a shape of a land, a ball, a pin or the like. The electrical connection metal 170 may be formed as a multilayer or a single layer (e.g., monolithic) structure. When formed as a multilayer structure, the electrical connection metal 170 may include a copper (Cu) pillar and a solder; and when formed as a single layer structure, the electrical connection metal 170 may include a tin-silver solder or copper (Cu). However, these materials are only examples, and embodiments of a material of the electrical connection metal 170 are not limited thereto. The number, an interval, a disposition form and the like of the electrical connection metals 170 are not limited to specific embodiments, and may be modified based on design particulars in accordance with various embodiments of the inventive concept. For example, the electrical connection metal 170 may be provided in an amount of approximately several tens to several tens of thousands based on the number of the first and second connection pads 125 and 165.

At least one of the electrical connection metals 170 may be disposed in a fan-out region. The fan-out region refers to an area outside of a region in which the first semiconductor chip 120 is disposed. That is, the semiconductor package 100A, according to some embodiments of the inventive concept, may be a fan-out semiconductor package. The fan-out package may have higher reliability than a fan-in package, may implement a plurality of input/output (I/O) terminals, and may facilitate a 3-dimensional (3D) interconnection. In addition, when compared with a ball grid array (BGA) package, a land grid array (LGA) package or the like, the fan-out package may be manufactured to have a smaller thickness, and may be cost efficient.

The molding material 180 may have an additional configuration for protecting the second semiconductor chip 160. The molding material 180 may cover at least a portion of the second semiconductor chip 160. The molding material 180 may include materials different from those included in the encapsulant 130. For example, the molding material may be an epoxy molding compound (EMC). In some embodiments, the molding material 180 may be ground to reach the second semiconductor chip 160. As a result of the grinding, an upper surface of the second semiconductor chip 160 may be exposed. According to some embodiments, an additional package, for example, a memory package, may further be disposed in an upper portion of the molding material 180 in the form of a package-on-package (POP).

The first and second redistribution structures and the wiring structure may be electrically connected to each other. The first and second redistribution structures and the wiring structure may provide a control signal path S1 electrically connecting the first connection pad 125 of the first semiconductor chip 120 and the second connection pad 165 of the second semiconductor chip 160. For example, the second semiconductor chip 160 may be electrically connected to the first semiconductor chip 120 by the control signal path S1, which may span the first redistribution layer 142, the first redistribution via 143, the wiring layers 112a to 112c, the wiring via layers 113a and 113b, the second redistribution layer 152, the second redistribution via 153, the third pad 154, and the bonding wire 168. The second semiconductor chip 160 may operate by way of an electrical connection to the first semiconductor chip 120. In the control signal path S1, a disposition form and/or a number of the first redistribution layer 142, the first redistribution via 143, the wiring layers 112a to 112c, and the like, are not limited to specific embodiments and embodiments may vary according to a device design. In some embodiments, the control signal path S1 may be an electrical signal path electrically connecting the first and second semiconductor chips 120 and 160 without being connected to the second pad 145.

The first and second redistribution structures and the wiring structure may provide a test signal path S2 electrically connecting the second connection pad 165 of the second semiconductor chip 160 and the second pad 145. For example, the test signal path S2 may be a signal path connecting the first redistribution layer 142, the first redistribution via 143, the wiring layers 112a to 112c, the wiring via layers 113a and 113b, the second redistribution layer 152, the second redistribution via 153, the third pad 154, and the bonding wire 168 between the second pad 145 and the second semiconductor chip 160.

The test signal path S2 may be an electrical path electrically connecting the second pad 145 and the second semiconductor chip 160 without the first semiconductor chip 120. The second semiconductor chip 160 may be directly connected to an external environment through the test signal path S2 and may be configured to perform a test for defects, such as cracks, electrical shorts, and the like. This may enable detection of defects, which may occur during manufacturing of the second semiconductor chip 160 in advance. Prior to a performance test of a complete semiconductor package, a defect of the stacked second semiconductor chip 160 may be discovered, thereby reducing a testing time. Further, damage to a testing device, which may occur due to overcurrent caused by cracking or a short, may be prevented. In some embodiments, when testing the second semiconductor chip 160 through the test signal path S2, the first semiconductor chip 120 may not operate.

In some embodiments, the second connection pad 165, which is electrically connected to the second pad 145 through the test signal path S2, may be identical to or different from the second connection pad 165 electrically connected to the first connection pad 125 through the control signal path S1. The control signal path S1 and the test signal path S2 may or may not share the same second connection pad 165 in accordance with various embodiments of the inventive concept.

The test signal path S2 may include a first section that is shared with the control signal path S1 and a second section branched from the control signal path S1 to be connected to the second pad 145. The second section may be branched from the control signal path S1 in the wiring structure.

Figure 3:
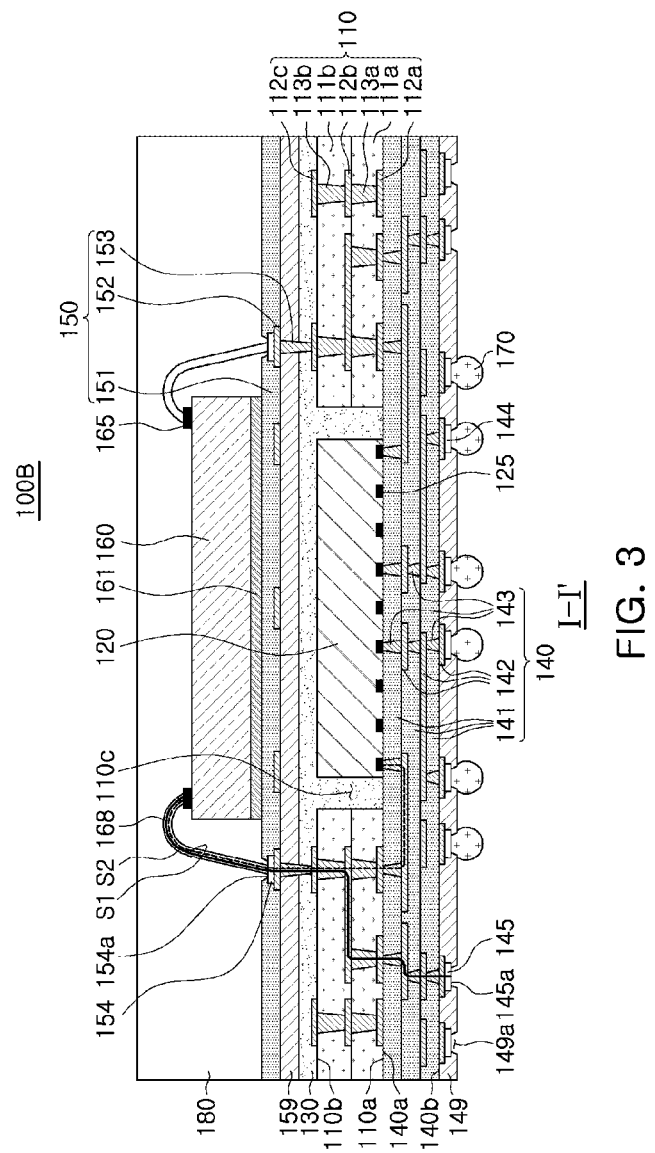
FIG. 3 is a cross-sectional view illustrating a semiconductor package according to some example embodiments of the present inventive concept.

FIG. 3 is a cross-sectional view illustrating a semiconductor package according to some embodiments of the inventive concept. FIG. 3 illustrates a region corresponding to a cross-section taken along line I-I' of the semiconductor package of FIG. 1.

In contrast to the embodiment described in FIG. 2, a semiconductor package 100B, according to some embodiments of the inventive concept, has a test signal path S2 including a first section, which is shared with the control signal path S1, and a second section branched from the control signal path S1 for connection to the second pad 145. The second section may be branched from the control signal path S1 in the first wiring structure. For example, the second section may be branched from the control signal path S1 in the second wiring layer 112b. In other words, the control and test signal paths S1 and S2 may share a signal path connecting the second connection pad 165, the bonding wire 168, the third pad 154, the second redistribution layer 152, the second redistribution via 153, the third wiring layer 112c, the second wiring via layer 113b and the second wiring layer 112b, but embodiments are not limited thereto. The second connection pad 165 electrically connected to the second pad 145 through the test signal path S2 may be identical to or different from the second connection pad 165 electrically connected to the first connection pad 125 through the control signal path S1 in accordance with various embodiments of the inventive concept.

In some embodiments, the second section may branch from the control signal path S1 in the first wiring layer 112*a*. In other embodiments, the second section may branch from the third wiring layer 113*c*, but embodiments of the inventive concept are not limited thereto.

Figure 4:
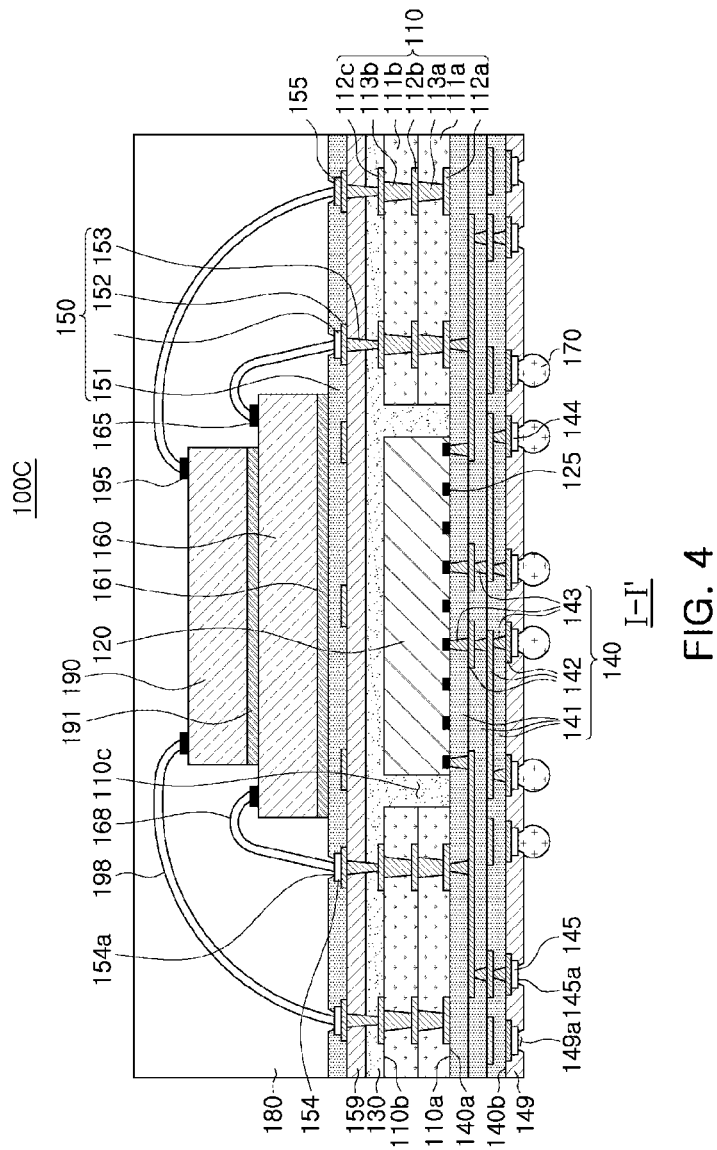
FIG. 4 is a cross-sectional view illustrating a semiconductor package according to some example embodiments of the present inventive concept.

FIG. 4 is a cross-sectional view illustrating a semiconductor package according to some embodiments of the inventive concept. FIG. 4 illustrates a region corresponding to a cross-section taken along line I-I' of the semiconductor package of FIG. 1.

A semiconductor package 100C, according to some embodiments of the inventive concept, may further include an adhesive layer 191 on a second semiconductor chip 160, a third semiconductor chip 190 disposed on the adhesive layer 191 and including the third connection pad 195, a bonding wire 198 connected to the third connection pad 195, and a fourth pad 155 on a second redistribution layer 152 connected to the bonding wire 198.

The third semiconductor chip 160 may be an integrated circuit (IC), which may include several hundreds to several millions or more elements integrated in a single chip. The third semiconductor chip 190 may be a memory chip, such as a volatile memory (a dynamic random access memory (DRAM)), a non-volatile memory (a read only memory (ROM)), a flash memory, or the like. In addition, the third semiconductor chip 190 may have a smaller size than the second semiconductor chip 160, but embodiments are not limited thereto. The third semiconductor chip 190 may be independent from the first and second semiconductor chips 120 and 160, and may operate by way of an electrical signal path connected with wiring layers inside the first and second connection structures 140 and 160, which are formed separately. This serves for mounting or lamination of various semiconductor chips, as well as provision of a miniaturized semiconductor package. The semiconductor package, according to some embodiments of the inventive concept, is not limited to a package on which the third semiconductor chip 190 is further stacked; it may have a plurality of semiconductor chips stacked in some embodiments.

FIGS. 5 to 13 are cross-sectional diagrams illustrating, in order, a manufacturing process of a semiconductor package according to some embodiments of the inventive concept.

Figure 5:
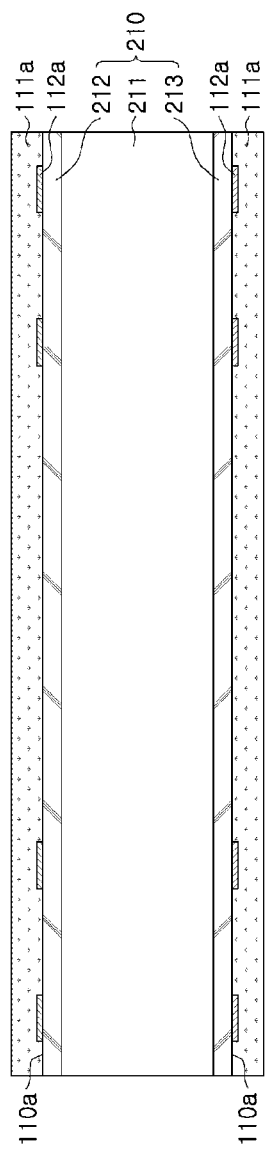
FIGS. 5 to 13 are cross-sectional diagrams illustrating, in order, a manufacturing process of a semiconductor package according to some example embodiments of the present inventive concept.

Referring to FIG. 5, a first wiring layer 112*a* and a first insulating layer 111*a* may be formed on a carrier board 210.

The carrier board 210 may include a core layer 211 and metal films 212 and 213 formed on both surfaces of the core layer 211. The core layer 211 may be an insulating resin or an insulating resin (for example, prepreg) containing an inorganic filler and/or a glass fiber, and the metal films 212 and 213 may be a film of a metal, such as copper (Cu). A release layer (not illustrated) may be disposed on one surface of the carrier board 210. Such a configuration of the carrier board 210 and the use of the release layer may be embodied in various forms.

The first wiring layer 112*a* is provided as a pattern without an integrated connecting via. In this process, the first wiring layers 112*a* are formed on both surfaces of the carrier board 210, and the first insulating layer 111*a* may be formed thereon so as to at least partially cover the first wiring layer 112*a*. The first insulating layer 111*a* may be formed by laminating the same in the form of a film or applying and hardening the same in a liquid form.

Figure 6:
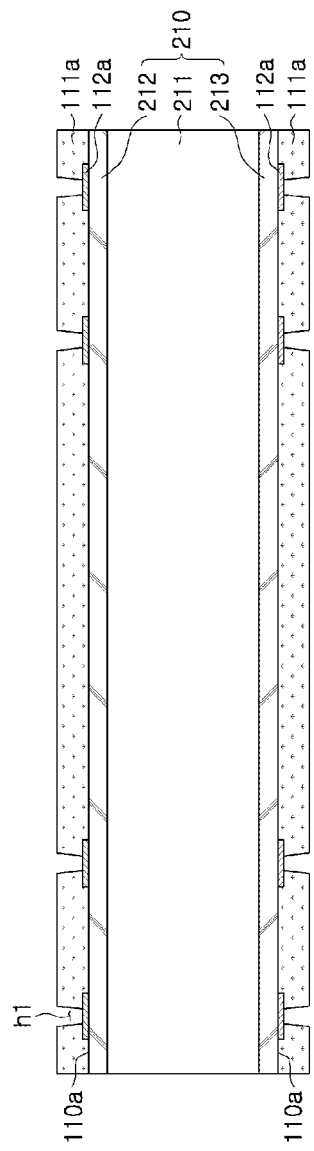

Referring to FIG. 6, a first via hole h1 may be formed on the first insulating layer 111*a*.

The first via hole h1 at least partially exposing a portion of the first wiring layer 112*a* may be formed on the first insulating layer 111*a*. When the first insulating layer 111*a* is a PID, the first via hole h1 of the first insulating layer 111*a* may be formed using a photolithography process, and a fine pitch hole arrangement may be feasible.

Figure 7:
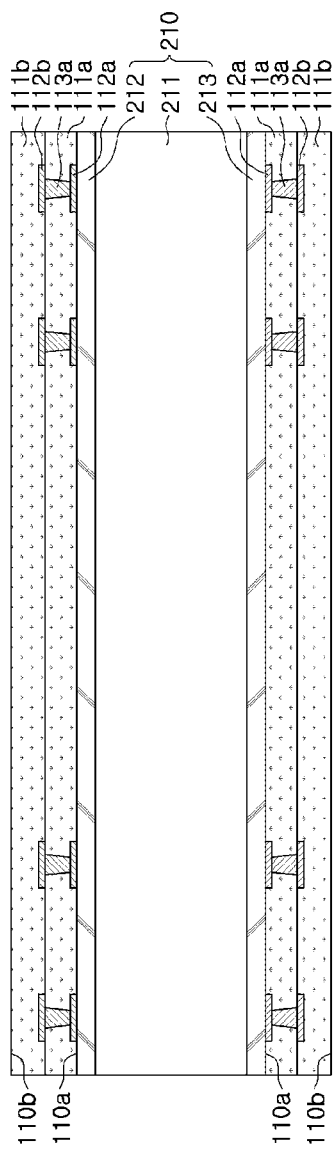

Referring to FIG. 7, a first wiring via layer 113*a* in and at least partially filling the first via hole h1 and a second wiring layer 112*b* connected to the first wiring via layer 113*a* and on and covering at least a portion of the first insulating layer 111*a* may be formed. A second wiring layer 112*b* and a second insulating layer 111*b* on and covering at least a portion of the first insulating layer may then be formed.

The second wiring layer 112*b* may be formed together with the first wiring via layer 113*a* by forming a dry film in a desired pattern and plating the same. The first wiring via layer 113*a* may have a cross-section shape tapered by a direction of formation thereof. For example, the first wiring via layer 113*a* may have a decreasing width in a direction from the second wiring layer 112*b* to the first wiring layer 112*a*.

Figure 8:
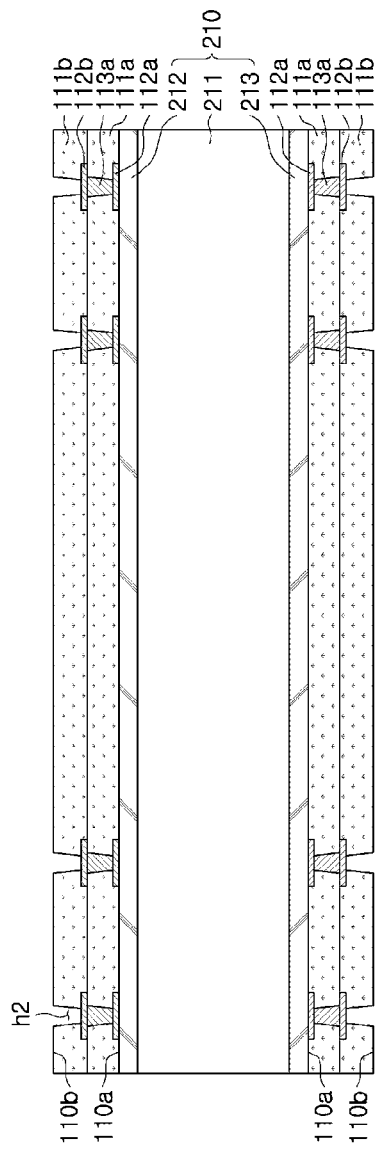
Figure 9:
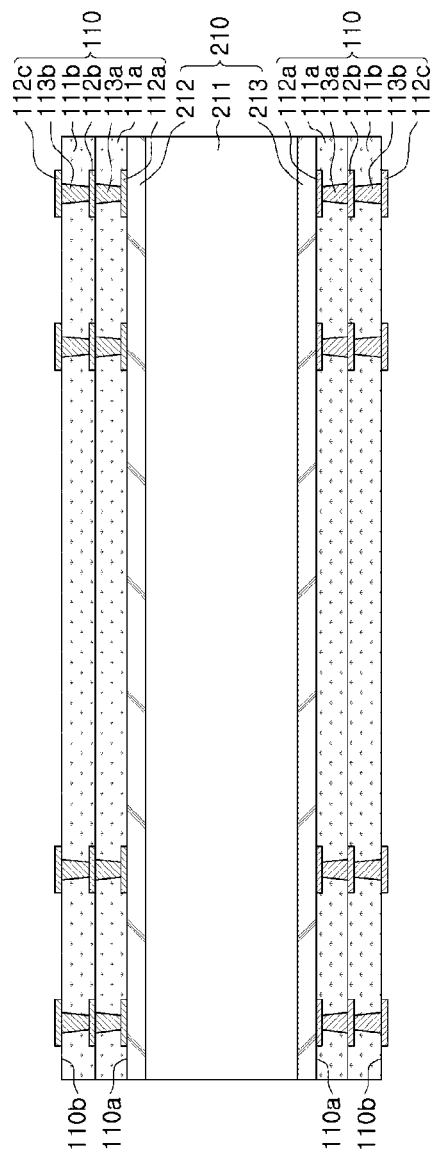

Referring to FIGS. 8 and 9, a second via hole h2 is formed on the second insulating layer 111*b*, and a second wiring via layer 113*b* in and at least partially filling the second via hole h2 and a third wiring layer 112*c* connected to the second wiring via layer 113*b* and on and covering at least a portion of the second insulating layer 111*b* may be formed. This may give rise to formation of a frame 110 including the first and second insulating layers 111*a* and 111*b*, the first to third wiring layers 112*a* to 112*c*, and the first and second wiring via layers 113*a* and 113*b*.

Figure 10:
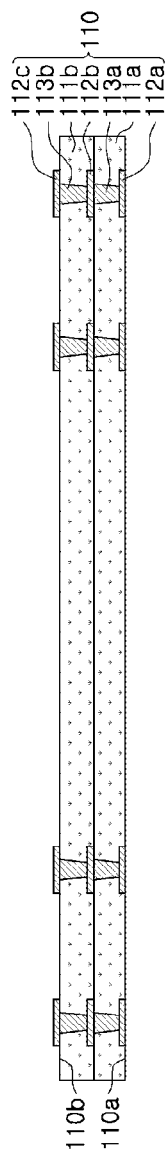

Referring to FIG. 10, the carrier board 210 may be removed. By removing a core layer 211 and the metal films 212 and 213, the frames 110 formed on both surfaces may be obtained. The frame 110 may have a first surface 110*a* on which the third wiring layer 112*c* is disposed and at least a portion of the second insulating layer 111*b* is exposed and a second surface 110*b* on which at least a portion of the first insulating layer 111*a* is exposed.

Figure 11:
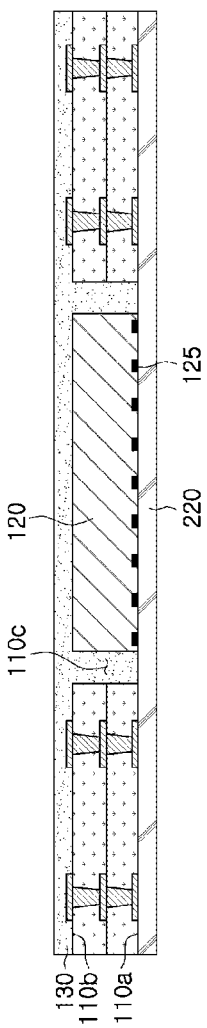

Referring to FIG. 11, the frame is adhered to an adhesive film 220, a through-hole 110*c* having a through-hole shape is formed to pass through a center of the frame. A first semiconductor chip 120 is mounted in the through-hole 110*c*, and an encapsulant 130 that seals the first semiconductor chip 120 is formed.

The adhesive film 220 may be attached to a lower portion of the first insulating layer 111*a*. The adhesive film 220 may be a tape, or the like, containing an epoxy resin. The first semiconductor chip 120 is built in the through-hole 110*c* of the frame, and an appropriate sealing material is used to form the encapsulant 130 sealing the first semiconductor chip 120. The encapsulant 130 extends to an upper surface of the frame to at least partially cover the third wiring layer 112*c*. The first semiconductor chip 120 includes the first connection pad 126 and may be mounted, such that a surface on which the first connection pad 125 is disposed faces the adhesive film 220 inside the through-hole 110*c*.

Figure 12:
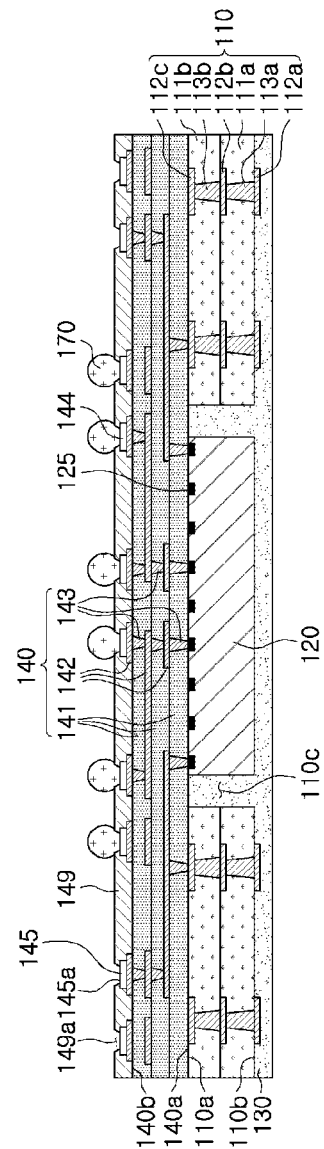

Referring to FIG. 12, after the adhesive film 220 is removed, the first connection structure 140 may be formed on the surface from which the film has been removed.

The first connection structure 140 may be disposed on the first surface 110*a* of the frame 110. The first connection structure 140 may be formed by forming an insulating layer 141 using a lamination method or an application method and a via hole on the insulating layer 141 followed by forming the first redistribution layer 142 and the first redistribution via 143 by electroplating or electroless plating. When a PID is used as an insulating layer, the via hole may be formed with a fine pitch using a photolithography method.

The first redistribution vias 143 may be connected to the first connection pad 125 of the first semiconductor chip 120, and to the first redistribution layer 142. At least one of the first redistribution layers 142 may be electrically connected together with the first wiring layer 112a and the first connection pad 125. The at least one of the first redistribution layers 142 electrically connected together with the first wiring layer 112a and the first connection pad 125 is electrically connected to the second pad 145 in the edge region of the fourth surface 140b of the first connection structure to provide an electrical path for testing a semiconductor chip. A lower surface 145a of the second pad 145 may be at least partially exposed through a plurality of the openings of the first passivation layer 149, and may have an electrical signal applied thereto for testing the semiconductor chip through the lower surface 145a. The first pad 144 is disposed in a center region of the fourth surface 140b of the first connection structure 140, and an electrical connection metal 170 may be disposed on a lower surface 144a of the first pad 144. However, in some embodiments, no electrical connection metal 170 may be disposed on the lower surface 145a of the second pad 145.

Figure 13:
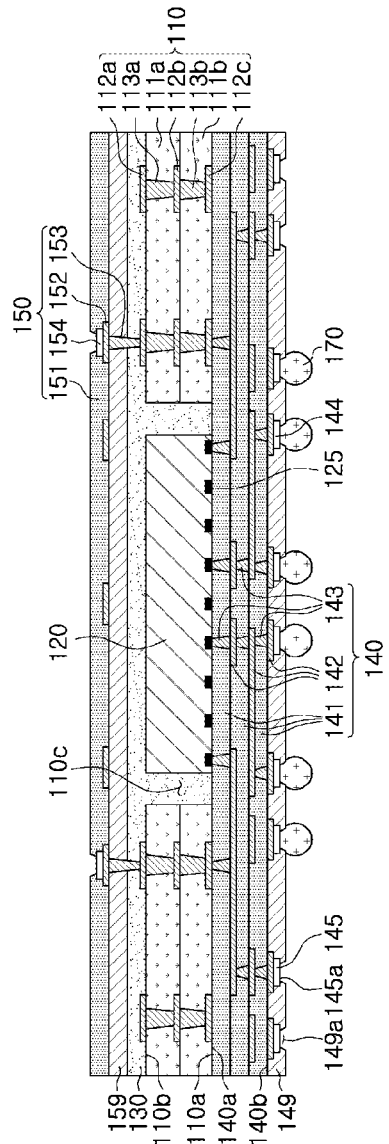

Referring to FIG. 13, the second connection structure 150 may be formed on a second passivation layer 159 after the second passivation layer 159 at least partially covering the encapsulant 130 is formed.

The second connection structure 150 may be disposed on the second surface 110b of the frame. The second connection structure 150 may be formed by forming an insulating layer 141 using a lamination method or an application method and a via hole on the insulating layer 141 followed by forming the first redistribution layer 142 and the first redistribution via 143 by electroplating or electroless plating. When a PID is used as an insulating layer, the via hole may be formed with a fine pitch using a photolithography method.

Referring to FIG. 2, an adhesive layer 161 is formed on the second connection structure 150, the second semiconductor chip 160 is formed on the adhesive layer 161, and a bonding wire 168, which electrically connects a second connection pad 165 disposed on the second semiconductor chip 160 and the third pad 154 connected to the second redistribution layer 152.

As set forth above, a semiconductor package having improved reliability may be provided through a defect test of a semiconductor chip including a test pad.

Various advantages and beneficial effects of the present disclosure are not limited to the above descriptions and may be understood from the above description of the various embodiments.

While embodiments have been shown and described above, it is apparent to those skilled in the art that modifications and variations could be made without departing from the scope of the present invention as defined by the appended claims.

What is claimed is:

1. A semiconductor package, comprising:
a first connection structure having a first surface and a second surface opposing the first surface, the first connection structure comprising a first redistribution structure including a first redistribution layer and a first redistribution via;
a first semiconductor chip on the first surface of the first connection structure and comprising a first connection pad electrically connected to the first redistribution structure;
a second connection structure on the first semiconductor chip and comprising a second redistribution structure including a second redistribution layer and a second redistribution via;
a vertical connection structure on at least one side of the first semiconductor chip and electrically connecting the first redistribution structure and the second redistribution structure;
a first pad and a second pad on the second surface of the first connection structure and electrically connected to the second redistribution structure;
a first passivation layer on the second surface of the first connection structure and having a plurality of openings, the first and second pads being accessible via the plurality of openings;
a second semiconductor chip on the second connection structure and comprising a second connection pad electrically connected to the second redistribution structure through a bonding wire; and
an electrical connection metal only on the first pad,
wherein the first and second redistribution structures and the vertical connection structure provide a control signal path electrically connecting the first connection pad of the first semiconductor chip and the second connection pad of the second semiconductor chip and a test signal path electrically connecting the second connection pad of the second semiconductor chip and the second pad.

2. The semiconductor package of claim 1, wherein the test signal path comprises a first section that is shared with the control signal path and a second section branched from the control signal path and connected to the second pad.

3. The semiconductor package of claim 2, wherein the second section is branched from the control signal path in the vertical connection structure.

4. The semiconductor package of claim 2, wherein the second section is branched from the control signal path in the first redistribution structure.

5. The semiconductor package of claim 1, wherein the electrical connection metal is not on the second pad.

6. The semiconductor package of claim 1, wherein a plurality of the openings of the first passivation layer comprises a testing opening in an edge portion of the second surface of the first connection structure, and a lower surface of the second pad is accessible via the testing opening.

7. The semiconductor package of claim 1, wherein the first pad is in a center region of the second surface of the first connection structure, and the second pad is in an edge region of the second surface of the first connection structure.

8. The semiconductor package of claim 1, further comprising a third pad having an upper surface electrically connected to the vertical connection structure,
wherein the bonding wire is electrically connected to the third pad.

9. The semiconductor package of claim 1, wherein the control signal path and the test signal path share the second connection pad.

10. The semiconductor package of claim 1, further comprising an encapsulant on the first surface of the first connection structure and encapsulating the first semiconductor chip.

11. The semiconductor package of claim 1, further comprising a third semiconductor chip on the second semiconductor chip,
  wherein the third semiconductor chip is electrically connected to a third pad on the second redistribution layer through the bonding wire.

12. The semiconductor package of claim 1, wherein the first and second pads comprise a nickel (Ni)/gold (Au) layer.

13. The semiconductor package of claim 1, wherein the first connection structure comprises a first redistribution insulating layer on at least a portion of the first redistribution via and the first redistribution layer,
  the second connection structure comprises a second redistribution insulating layer on at least a portion of the second redistribution via and the second redistribution layer, and
  the first and second redistribution insulating layers comprise a photoimagable insulating material.

14. A semiconductor package, comprising:
  a first semiconductor chip;
  a second semiconductor chip on the first semiconductor chip;
  a first connection structure below the first semiconductor chip and comprising a first redistribution structure electrically connected to the first semiconductor chip and having a first surface contacting the first semiconductor chip, the first redistribution structure including a first redistribution layer and a first redistribution via;
  a first pad on a center portion of a second surface of the first connection structure opposite the first surface;
  a second pad on an edge portion of the second surface;
  a second connection structure on the first semiconductor chip and comprising a second redistribution structure electrically connected to the second semiconductor chip and including a second redistribution layer and a second redistribution via;
  a vertical connection structure on at least one side of the first semiconductor chip and electrically connecting the first redistribution structure and the second redistribution structure; and
  an electrical connection metal on the first pad on the second surface,
  wherein the electrical connection metal is not on the second pad.

15. The semiconductor package of claim 14, further comprising a frame having a through-hole, the first semiconductor chip being in the through-hole of the frame,
  wherein the frame comprises a first insulating layer, first and second wiring layers respectively on opposite surfaces of the first insulating layer, respectively, second and third insulating layers on the surfaces of the first insulating layer and on at least a portion of the first and second wiring layers, respectively, a third wiring layer on a side of the second insulating layer opposite to a side on which the first wiring layer is embedded, a first wiring via layer passing through the first insulating layer and electrically connecting the first and second wiring layers, and a second wiring via layer passing through the second insulating layer and electrically connecting the first and third wiring layers.

16. The semiconductor package of claim 15, wherein the first, second, and third wiring layers and the first and second wiring via layers comprise a wiring structure, and
  wherein the first and second redistribution structures and the wiring structure provide a control signal path electrically connecting the first semiconductor chip and the second semiconductor chip and a test control signal path electrically connecting the second semiconductor chip and the second pad.

17. The semiconductor package of claim 14, wherein the first and second redistribution structures and the vertical connection structure provide a control signal path electrically connecting the first semiconductor chip and the second semiconductor chip and a test signal path electrically connecting the second semiconductor chip and the second pad,
  wherein the test signal path comprises a first section that is shared with the control signal path and a second section branched from the control signal path and connected to the second pad, and
  wherein the second section is branched from the control signal path in the vertical connection structure.

18. A semiconductor package, comprising:
  a first semiconductor chip comprising a first connection pad;
  a first connection structure below the first semiconductor chip and comprising a first redistribution structure electrically connected to the first semiconductor chip and including a first redistribution layer and a first redistribution via;
  a first passivation layer on the first connection structure and having a testing opening in an edge portion of the first connection structure;
  a second connection structure on the first semiconductor chip and comprising a second redistribution structure including a second redistribution layer and a second redistribution via;
  a second semiconductor chip on the second connection structure and electrically connected to the second redistribution structure, the second semiconductor chip including a second connection pad;
  a vertical connection structure on at least one side of the first semiconductor chip and electrically connecting the first redistribution structure and the second redistribution structure; and
  a test pad electrically connected to the first redistribution structure and having a lower surface accessible via the testing opening,
  wherein the first and second redistribution structures and the vertical connection structure provide a test signal path electrically connecting the second connection pad of the second semiconductor chip and the test pad.

19. The semiconductor package of claim 18, further comprising an electrical connection metal on a portion of the first passivation layer,
  wherein the electrical connection metal is not on the test pad.

20. The semiconductor package of claim 18, further comprising a third semiconductor chip on the second semiconductor chip,
  wherein the third semiconductor chip is electrically connected to a third pad on the second redistribution layer through a bonding wire.

* * * * *